United States Patent [19]

Bower

[11] Patent Number: 4,733,287
[45] Date of Patent: Mar. 22, 1988

[54] INTEGRATED CIRCUIT STRUCTURE WITH ACTIVE ELEMENTS OF BIPOLAR TRANSISTOR FORMED IN SLOTS

[75] Inventor: Robert W. Bower, Los Gatos, Calif.

[73] Assignee: Advanced Micro Devices, Inc., Sunnyvale, Calif.

[21] Appl. No.: 922,625

[22] Filed: Nov. 26, 1986

Related U.S. Application Data

[63] Continuation-in-part of Ser. No. 576,659, Feb. 3, 1984, abandoned.

[51] Int. Cl.[4] .................... H01L 29/72; H01L 27/12; H01L 29/06; H01L 29/04
[52] U.S. Cl. .................................... 357/34; 357/35; 357/49; 357/55; 357/59
[58] Field of Search .................. 357/35, 34, 49, 59 H, 357/59 G, 55

[56] References Cited

U.S. PATENT DOCUMENTS

| | | | |
|---|---|---|---|
| 3,681,668 | 8/1972 | Kobayashi | 357/59 |
| 3,703,420 | 11/1972 | Vora | 357/35 |
| 3,762,966 | 10/1973 | Engeler et al. | 357/36 |
| 4,062,034 | 12/1977 | Matsushita et al. | 357/16 |
| 4,104,086 | 8/1978 | Bondur et al. | 357/50 |
| 4,139,442 | 2/1979 | Bondur et al. | 357/50 |
| 4,160,991 | 7/1979 | Anantha et al. | 357/59 H |
| 4,302,763 | 11/1981 | Ohuchi et al. | 357/59 |
| 4,339,767 | 7/1982 | Horng et al. | 357/44 |
| 4,392,149 | 7/1983 | Horng et al. | 357/49 |
| 4,419,150 | 12/1983 | Soclof | 357/35 |
| 4,484,211 | 11/1984 | Takemoto et al. | 357/50 |

FOREIGN PATENT DOCUMENTS

| | | | |
|---|---|---|---|
| 0068072 | 5/1983 | European Pat. Off. | 357/50 |
| 2143083 | 1/1985 | European Pat. Off. | 357/35 |
| 54-116884 | 9/1979 | Japan | 357/50 |
| 57-11150 | 3/1982 | Japan | 357/50 |
| 57-201070 | 9/1982 | Japan | 357/50 |

OTHER PUBLICATIONS

"All Ion-Implant Bipolar Transistor Process", by Barbee et al., IBM Tech. Discl. Bul., vol. 24, No. 7A, 12/81.

Lillja et al, "Process for Fabrication of Shallow and Deep Silicon Dioxide Filled Trenches", *IBM Technical Disclosure Bulletin*, vol. 22, No. 11, Apr. 1980, pp. 4900–4902.

Wang et al, "Reactive-Ion Etching Eases Restrictions on Materials and Feature Sizes", *Electronics*, Nov. 3, 1983, pp. 157–161.

Minegishi et al, "A Sub-Micron CMOS Megabit Level Dynamic RAM Technology Using a Doped Face Trench Capacitor Cell", *Proceedings*, IEDM, 1983, pp. 319–322.

Morie et al, "Depletion Trench Capacitor Technology for Megabit Level MOS dRAM", *IEEE EDL*, vol. EDL-4, No. 11, Nov. 1983, pp. 411–413.

*Primary Examiner*—Andrew J. James
*Assistant Examiner*—D. Featherstone
*Attorney, Agent, or Firm*—Patrick T. King; John P. Taylor; J. Vincent Tortolano

[57] ABSTRACT

A bipolar transistor susceptible to high level integration has its active regions formed in slots within a semiconductor substrate. In one embodiment, the emitter is formed within a slot and has a surrounding region doped to function as a base. A collector is formed in another slot which is located adjacent but spaced apart from the emitter slot. Carrier transport occurs principally horizontally between the emitter and base and thence to the collector. Additional slots may be used to isolate the slot transistor in conjunction with a horizontally disposed pn junction and a buried collector. The collector may be formed in a slot which contains an oxidized outer sidewall that serves to isolate the individual transistor.

11 Claims, 27 Drawing Figures

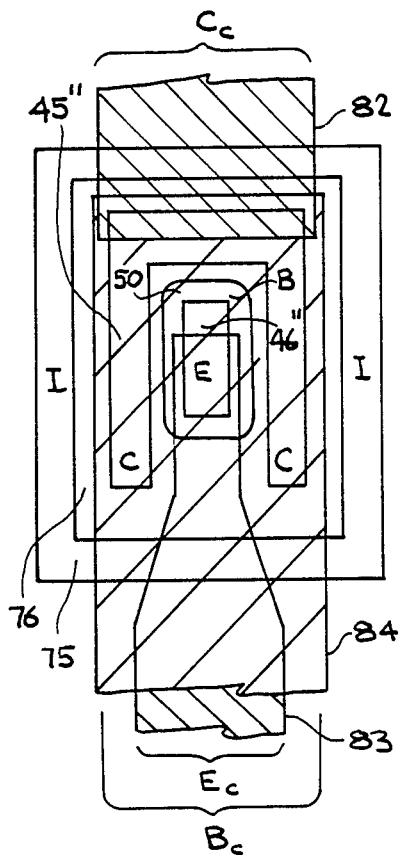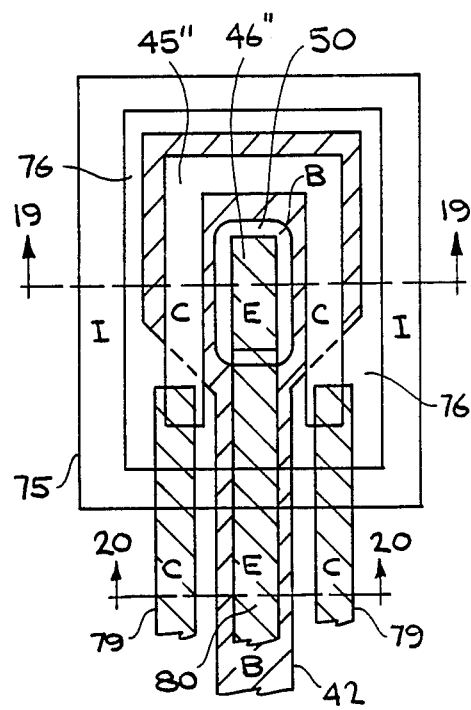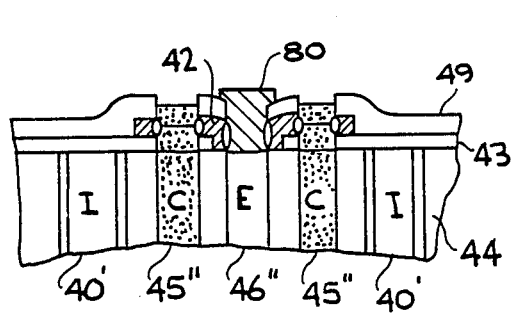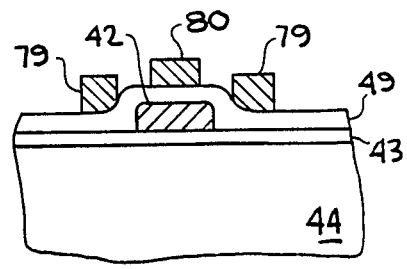
FIG. 21
FIG. 18
FIG. 19
FIG. 20

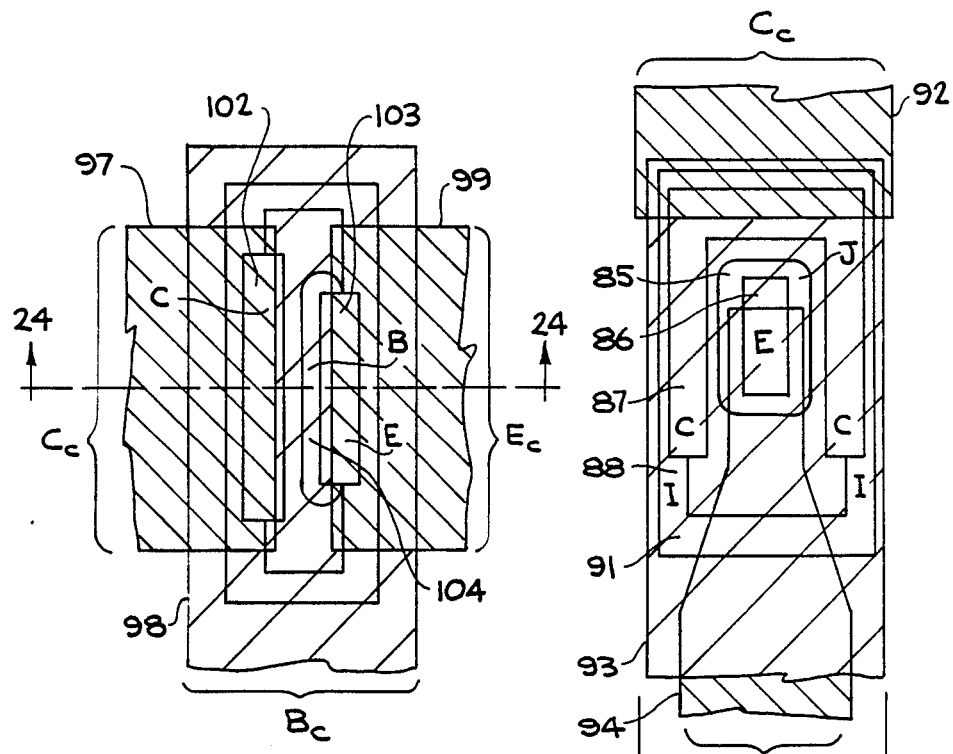
FIG. 23
FIG. 22
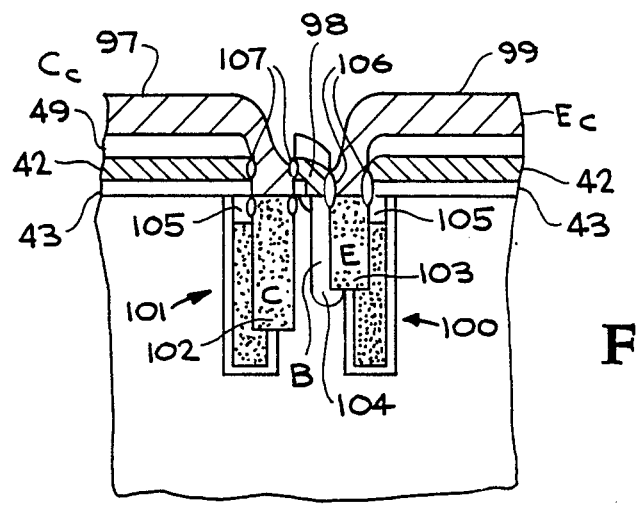
FIG. 24

INTEGRATED CIRCUIT STRUCTURE WITH ACTIVE ELEMENTS OF BIPOLAR TRANSISTOR FORMED IN SLOTS

CROSS-REFERENCE TO RELATED APPLICATIONS

This application is a continuation-in-part of Bower U.S. patent application Ser. No. 576,659, filed Feb. 3, 1984, now abandoned.

BACKGROUND OF THE INVENTION

1. Field of the Invention

This invention relates to a bipolar transistor formed in a slot. More particularly, this invention relates to formation of a bipolar transistor having its active regions formed in slots in an integrated circuit substrate.

2. Discussion of the Related Art

The density of integrated circuits continues to increase. Advances in lithography have permitted line width resolution to reach micron dimensions and processing techniques have improved to the point where the reliable formation of thin films and precise etching are both possible so that smaller and more predictable feature sizes can be obtained. As a consequence, the lateral dimensions of devices are reaching micron levels and passing on into nanometer ranges resulting in a continued decrease in the density of integrated circuits.

Thus, a greater number of individual devices can be fabricated in a given area. While further increases in areal density are likely, physical, equipment, and process limits are being approached. In addition, as devices become smaller and smaller, their power ratings are reduced and the relative importance of problems such as parasitic capacitance and contamination is increased. Due to the diminishing return to be obtained from further efforts to improve areal density, it has become desirable to consider the possibility of increasing the extent of the active regions in the vertical dimension to thereby obtain performance for a device with established lateral dimensions which is equivalent to the performance of a device with greater lateral dimensions. Also higher power or higher performance devices may be obtained in this way.

Bipolar transistors typically have a vertical structure as shown, for example in Horng et al U.S. Pat. No. 4,392,149 which relates to a method for formation of a bipolar transistor having an oxide spacer between the emitter and the external base region which permits very close spacing therebetween. A buried collector layer is provided which is connected to a collector contact by a well or reach through.

Ohuchi et al U.S. Pat. No. 4,302,763 describes a semiconductor device which includes a semiconductor substrate with a first region of first conductivity type in the substrate which apparently comprises the collector. A second region of a second conductivity type is also formed in the substrate adjacent to the first region and presumably forms the base of the transistor. A third region of the first conductivity type, which apparently includes the emitter, is formed adjacent to the second region and includes at least a portion on the substrate which is comprised of the same element as the substrate and oxygen. The band gap energy of this portion is said to be larger than that of the second region. A SIPOS layer is used to form the emitter by diffusion of the impurities of the SIPOS layer into the underlying base region.

As the densities of integrated circuits have increased, there has been serious consideration of using trench or slot formation processes for forming the insulating zones between individual transistors. See, e.g., D. N. K. Wang et al, "Reactive-Ion Etching Eases Restrictions on Materials and Feature Sizes", *Electronics*, Nov. 3, 1983, pp. 157, 159 (157–159?). In theory, slot isolation would allow individual devices to be packed closer together. Such an isolation technique is described in Bondur et al U.S. Pat. No. 4,104,086 as well as in Bonn U.S. Pat. Ser. No. 719,085 and Gwozdz U.S. patent application Ser. No. 759,621, both of which applications are assigned to the assignee of this application. Bower U.S. Pat. No. 4,533,430 describes and claims a process for forming such slots having near vertical sidewalls at their upper extremities to avoid formation of voids when refilling the slot.

Bondur et al U.S. Pat. No. 4,139,442 discloses the formation of a deeply recessed oxidized region in silicon by forming a series of closely spaced trenches and then oxidizing the walls of the trenches to utilize all of the remaining silicon comprising the walls of adjoining trenches. Lillja et al, in an article entitled "Process For Fabrication Of Shallow and Deep Silicon Dioxide Filled Trenches", published in IBM Technical Disclosure Bulletin, Vol. 22, No. 11 in April, 1980, describes the process steps involved in forming a bipolar transistor in an integrated circuit structure using isolation oxide materials which comprises forming a shallow oxide trench to separate the base and collector contact regions and a deeper oxide filled trench which surrounds the entire transistor.

Takemoto et al U.S. Pat. No. 4,484,211 teaches a bipolar transistor structure with an oxide isolation between the emitter and and the extrinsic base so that the capacitance between the emitter and the base is lowered.

Horng et al U.S. Pat. No. 4,339,767 discloses a process for forming a vertical NPN transistor and a lateral PNP transistor at the same time on a substrate with deep oxide-filled trenches electrically isolating the devices from one another. To eliminate the emitter current ejecting into the substrate, the P+ emitter and the P+ collector of the lateral PNP transistor are bounded by a silicon nitride and silicon dioxide dielectric layer.

In addition to forming slots in semiconductor wafers for isolating individual devices, slots have also been considered for use as passive circuit elements. For example, it has been proposed that a slot be filled with an appropriate material so that it will function as a capacitor. See, e.g., K. Minegishi et al., "A Sub-Micron CMOS Megabit Level Dynamic RAM Technology Using a Doped Face Trench Capacitor Cell", Proceedings, IEDM, 1983, p. 319; and T. Morie et al., "Depletion Trench Capacitor Technology for Megabit Level MOSdRAM", *IEEE Electron Device Letters*, v. EDL-4, No. 11, p. 411, Nov. 1983. Such applications are possible because with appropriate filling materials a slot can be made to be conductive or insulating as required.

It has also been proposed to construct active devices in slots in a substrate. Fujitsu Japanese Patent Document No. 57-11150 discloses construction of a lateral bipolar transistor wherein an emitter region is formed in a substrate by diffusing impurities into the substrate through the walls of a first slot formed in the substrate. A collector region is similarly formed in the substrate using a second slot formed in the substrate, located adjacent the first slot, to diffuse impurities into the substrate. The portion of the substrate between the emitter region and the collector region in the substrate is said to form the base of the transistor.

Engeler et al U.S. Pat. No. 3,762,966 teaches the formation of a bipolar transistor with precise control over width of the base region. The transistor is formed by first growing an N-type doped epitaxial layer over a heavily doped N-type semiconductor wafer to form a collector layer and then diffusing a heavily doped P-type base contact region into the epi layer. The structure is then masked with an oxide layer through which one or more openings or holes are etched through the base contact region into the N-type collector layer to permit formation of one or more emitters. Strongly N-type semiconductor material, containing both N-type impurities and faster diffusing P-type impurities, is then epitaxially grown to fill the holes. The structure is then heated to form an active base region below the emitter by diffusion into the epi collector layer of acceptor impurities from the doped epitaxial emitter material. The active base region is in contact with the epitaxial base contact region adjacent the emitter region. Metal contact are then formed to the epitaxial collector layer, the emitter, and the base contact region to complete the transistor.

Vora U.S. Pat. No. 3,703,420 discloses various methods for constructing lateral transistors in integrated circuit structures, respectively using monocrystalline and polycrystalline silicon which comprises forming a first epitaxial layer over a substrate and then doping an upper portion of this layer to form a base contact region therein. In the polycrystalline method, silicon oxide islands are formed on the epi layer and a second layer of epitaxial silicon is grown over the first layer. The second epitaxial layer is monocrystalline above the substrate and polycrystalline above the silicon dioxide. The structure is then masked to form openings in registry with the polysilicon portions and doped to form the active elements of the lateral transistor. The so-formed polycrystalline portions are used to convey dopant laterally into the adjacent monocrystalline portions to form the respective active elements of the lateral transistor. In both the monocrystalline and polycrystalline embodiments, the base and emitter are formed by doping through the same opening in the mask to form lateral P-N junctions between the base and emitter in the monocrystalline silicon. The base contact region in the first epi layer connects the base with a base electrode.

SUMMARY OF THE PRESENT INVENTION

In accordance with the present invention, a bipolar transistor is formed in a slot in a substrate wherein a base region is first formed in the walls and bottom of a first slot which is filled with a substance which will form an emitter in the slot to thereby provide a self-aligned structure with a large base-emitter surface junction. Carrier transport occurs both laterally and vertically between the emitter in the slot and the surrounding base. A second slot, providing a collector contact region, is formed in alignment with the emitter slot. A buried collector layer, located beneath the portion of the base region formed in the substrate beneath the emitter slot, communicates with the collector contact region.

Such a construction results in a high performance device having lower collector-to-base and collector-to-substrate capacitances due to the respective relationships between the physical collector and base regions and the active collector and base regions.

BRIEF DESCRIPTION OF THE DRAWINGS

For a more complete understanding of the bipolar transistor of the present invention, reference may be had to the accompanying drawings which are incorporated herein by reference and in which:

FIG. 2b is a plan view of the structure of FIG. 2a;

FIG. 3b is a plan view of the transistor of FIG. 3a;

FIG. 4b is a plan view of the transistor of FIG. 4a;

FIGS. 5–13 are a sequence of cross-sectional views showing the formation of a slot transistor in accordance with the present invention in which: FIG. 5 shows the formation of isolation slots which bracket a transistor to be formed;

FIG. 6 shows the cross-section of FIG. 5 after the oxidation of the slot surface, the filling of isolation slots, the application of a thin etch stop layer defining a central emitter slot region 39 and the application of an overlying layer of polycrystalline silicon;

FIG. 7 shows the cross-section of FIG. 6 after the application of a layer of silicon dioxide and the opening up of a central emitter slot channel 46;

FIG. 8 is the cross-section of FIG. 7 after the partial formation of an emitter slot and the oxidation of polycrystalline silicon and the sidewalls of the partially formed slot and the definition of collector slot regions;

FIG. 9 is a cross-sectional view of FIG. 8 after the emitter slot region has been fully formed and a base region has been formed by diffusing;

FIG. 10 is an alternate cross-section for FIG. 9, following the cross-section of FIG. 8, after the formation of an emitter slot region, the diffusion of a base region and the formation of base contacts;

FIG. 11 is a cross-section of FIG. 10 after the partial formation of collector slots and the oxidation of polysilicon and silicon sidewalls and the filling of emitter slot;

FIG. 12 is a cross-section of FIG. 11 after the complete formation of the collector slots;

FIG. 13 is a cross-section of FIG. 12 after the collector slots have been filled and contacts have been formed to the base and collector regions;

FIG. 19 is a cross-sectional view of FIG. 18 taken through line 19—19;

FIG. 20 is a cross-sectional view of FIG. 18 taken through line 20—20;

FIG. 21 is a plan view of another contact scheme for the embodiment of FIG. 18;

FIG. 22 is a contact scheme of another embodiment of the present invention;

FIG. 23 is a plan view of a contact scheme of another embodiment of the slot transistor of the present invention; and FIG. 24 is a cross-sectional view of FIG. 23 taken through line 24—24.

DESCRIPTION OF THE PREFERRED EMBODIMENTS

The active area of a transistor is determined by the size of the emitter. As lateral dimensions are reduced, it is only possible to increase this area for a given cross-sectional size by increasing the vertical dimension of the device. A bipolar transistor having an enhanced vertical dimension also may have a performance very close to the theoretical maximum due to the low levels of the critical components of parasitic capacitance. For example, in most circuit applications the collector-to-base capacitance (CCB) and the collector-to-substrate capacitance (CCS) are important parameters in determining device performance.

Figure 1:
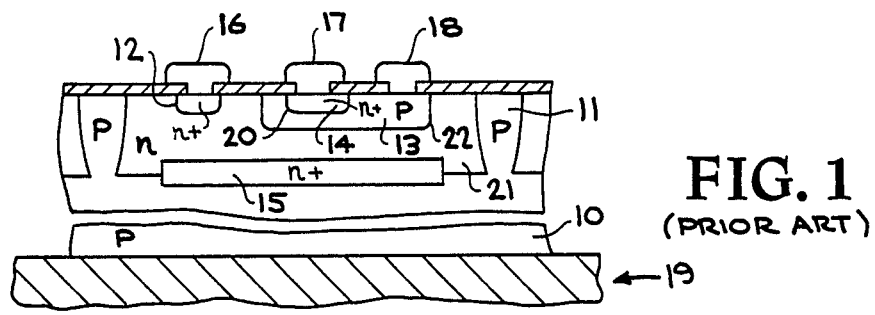
FIG. 1 is a cross-sectional view of an npn bipolar transistor of the prior art.

As shown in the prior art of FIG. 1, a typical bipolar transistor has an emitter 14 formed in a base region 13 which is in contact with a collector region 21. The device depicted is an npn transistor. Conduction of carriers across the pn junctions occurs over the full areal extent of the junctions. However, since the junctions are primarily horizontally disposed most of the carriers traverse a vertical or near vertical path. The vertical character of the carrier flow is enhanced by the presence of n+ buried collector 15 which takes away any lateral component of carrier flow that would result if the current flowed from base 13 through the bulk of collector 21 directly to collector contact region 12 and collector contact 16. Carrier flow, then, is from the emitter 14 to the base 13 across the junction 20 and between the base 13 and n+ buried collector 15 across the junction 22 and thence to collector contact region 12 and collector contact 16. As the densities of bipolar integrated circuits increase, the horizontal component of the two junctions decreases compared to the vertical component as the overall junction area decreases. This, in turn, reduces the gain of the transistor, and generally reduces performance by increasing parasitic capacitance, both undesirable consequences.

In vertical bipolar transistors of the prior art, as shown in FIG. 1, the physical collector is usually much larger than the active collector region in order to make effective electrical contact. With the slot structure of the present invention; however, the physical collector and the physical base are each virtually equal to the active base thereby reducing the related parasitic capacitances (CCB and CCS) to their minimums. The base-to-emitter capacitance (CBE) is larger due to the increased base doping allowed by the use of a SIPOS emitter; fortunately, CBE is not a critical determinant of speed in most bipolar circuits.

These various characteristics are set out in Table 1 which compares a transistor reported in the bipolar literature (see D. D. Tang et al, "1.25 Micron Deep Groove Isolated Self-Aligned Bipolar Circuits", *IEEE J. of Solid State Circuits*, Vol. 17, October, 1982, p. 925) with the slot type bipolar transistor produced in accordance with the present invention. As seen in Table 1, the slot type transistor has a significant improvement in the critical parasitic capacitances CCB and CCS and only has lower performance in the non-critical parasitic capacitance CBE. Thus, it is expected that the slot type transistor will not only be twice as dense as the prior art bipolar devices but will have better performance.

Figure 2A:
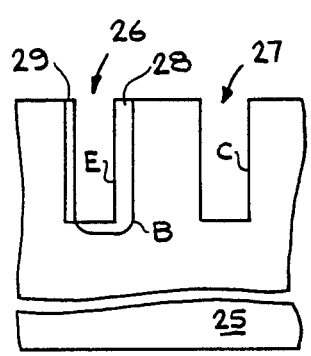
FIG. 2a is a cross-sectional view of a slot transistor structure of the present invention.
Figure 3A:
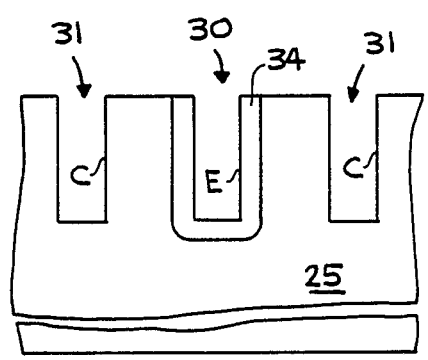
FIG. 3a is a cross-sectional view of another embodiment of the slot transistor structure of the present invention.
Figure 4A:
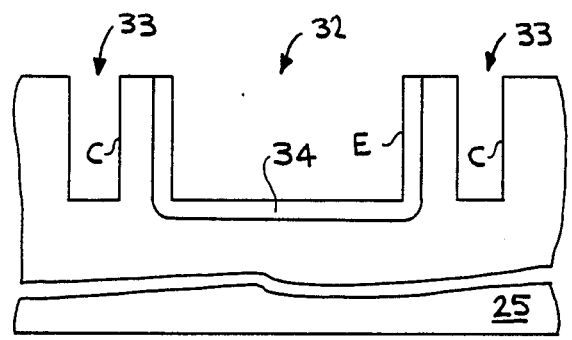
FIG. 4a is a cross-sectional view of a more complex slot transistor structure in accordance with the present invention.

Various configurations for the slot transistor structure of the present invention are shown in cross-section in FIGS. 2a, 3a, and 4a. The common structural feature is that the emitter and collectors are formed in slots. In FIG. 2a, an emitter slot 26 is shown to be fabricated in spaced apart relationship from a collector slot 27. A base region 28 is diffused into semiconductor substrate adjacent emitter slot 26. In the embodiment of FIG. 2a, a diffusion barrier 29 has been formed along the left-hand wall of emitter slot 26 so that there is no diffusion into the left-hand side of the substrate 25 adjacent emitter slot 26. Carrier conduction will be from left to right, i.e., from the conductive SIPOS filling (not shown) in emitter slot 26 through base region 28 and into the SIPOS-filled (not shown) collector slot 27. SIPOS (Semi-Insulating Polycrystalline Silicon) may be doped to be a conductive material suitable for functioning as the active regions in transistors as described, for example, in T. Matsushita et al, "A SIPOS-Si Heterojunction Transistor", *Japan J. Applied Physics*, Vol. 20, Suppl. 20-1, pp. 75–81 (1981).

Figure 2B:
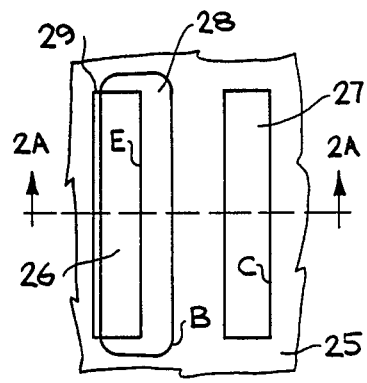
Figure 3B:
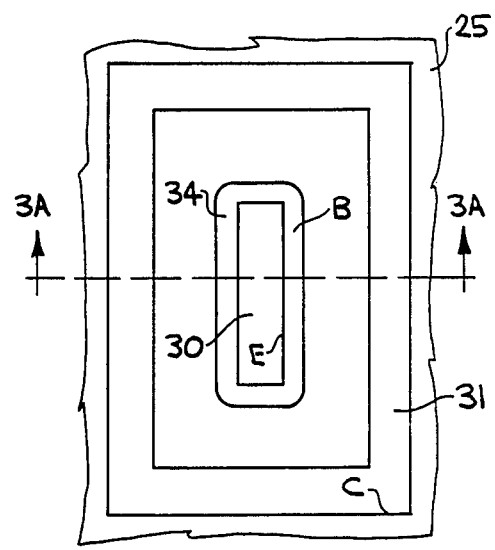

In the plan view of FIG. 2b, it is seen that the length of the emitter slot 26 and collector slot 27 are equal and that the slots are arranged in parallel spaced apart relationship. A second, probably more efficient, arrangement is shown in the cross-section of FIG. 3a. Here, collector slots 31 are formed on both sides of emitter slot 30. As seen in the plan view of FIG. 3b, the collector slot 31 forms a continuous slot which surrounds the rectilinear emitter slot 30. In this embodiment, base region 34 fully surrounds emitter slot 30. Carrier conduction is thus laterally outward from emitter slot 30 through base 32 to collector slots 31.

Figure 4B:
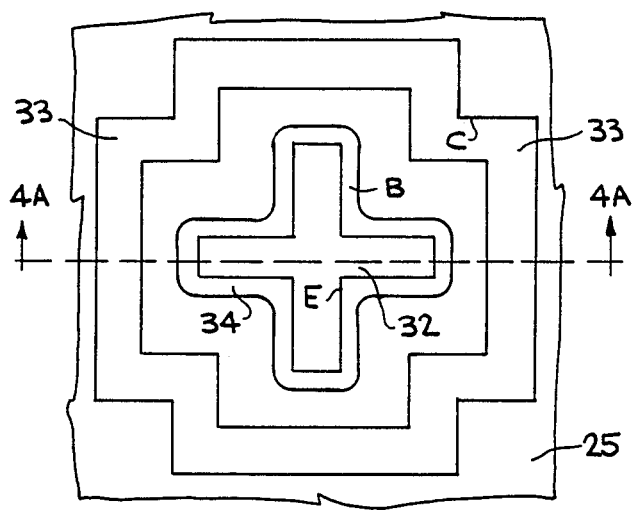

Another structure in accordance with the present invention is shown in cross-section in FIG. 4a. Here, an elongated emitter slot 32 is shown to have collector slots 33 formed in parallel spaced-apart relationship. As seen from the plan view of FIG. 4b, the emitter slot 32 is shaped in the form of a cross with the collector slot 33 being formed around it in congruent relationship. Typical widths for the slots in the various embodiments will be 0.1 to 0.3 micrometers for the base, 1 to 1.5 micrometers for the collector slot, and 1 to 1.5 micrometers for the emitter slot. The slot depths will vary depending upon application but will be in the range of 5 to 30 micrometers.

A process for fabricating the structure of the present invention is shown in the series of FIGS. 5–13. Although the structure of the present invention may also be fabricated in III–V compounds with those masking and filler materials being used which are known in the art to be appropriate to the particular III–V material, for the purpose of this specification, the ensuing description will be of a silicon substrate with masking and filler materials which are compatible chemically and metallurgically.

Figure 5:
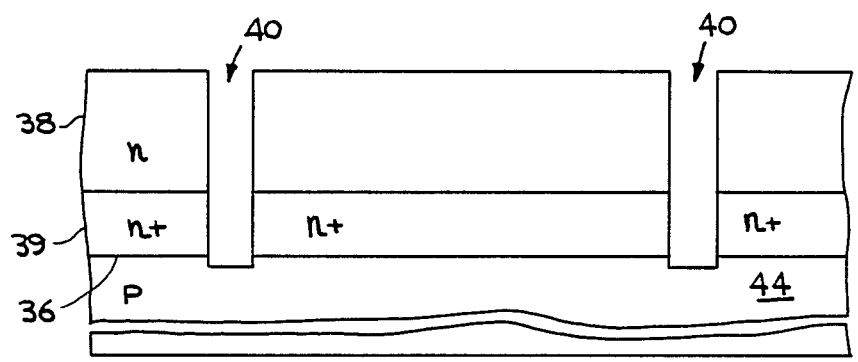

Referring now to FIG. 5, an n+ buried diffusion layer 39 has been formed in substrate 44 and an n— type epitaxial layer 38 has been grown on the surface of n+ buried layer 39. The n+ buried layer 39 serves to reduce series resistance in the collector contact as described subsequently, particularly with respect to FIGS. 12 and 13. The term "substrate", as used herein-after, will include the buried layer and the epitaxial layer grown on the surface of the buried layer.

Still referring to FIG. 5, isolation slots 40 are shown to be formed in a semiconductor substrate 44. Isolation slots 40 extend through pn junction 36 formed between n+ layer 39 and p-type substrate 44 in order to isolate the bipolar transistor to be formed from adjacent transistors fabricated in the same integrated circuit.

Figure 6:
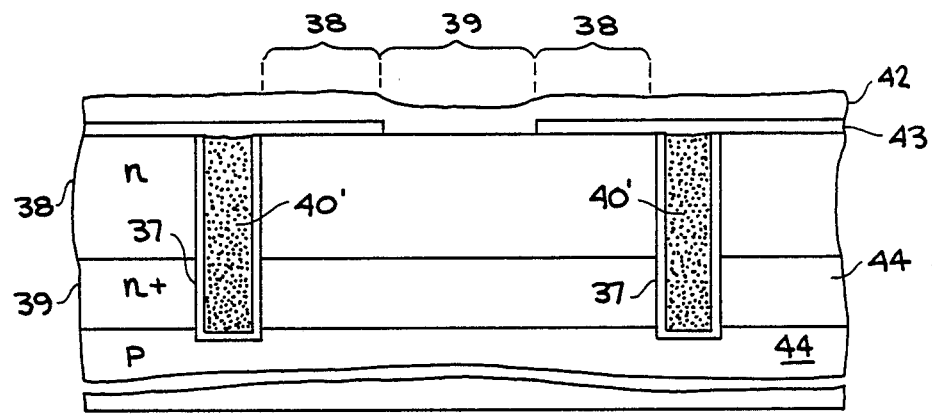

In the isolation slots 40 of FIG. 5, a thin silicon dioxide layer 37 is grown over the entire interior surface. This layer accomplishes the electrical isolation. Then, a filler material 40' is applied as shown in FIG. 6. The filler material is selected from the classes of conductive and insulating materials including, such materials as silicon nitride, SIPOS, polycrystalline silicon, metal oxides, silicon, silicon dioxide, etc. The material must readily flow into the slots or deposit on the surface of the slot, preferably in an isotropic fashion. The choice of filler material will generally reflect the desire to have a material which has the same coefficient of thermal expansion as the surrounding silicon in order to avoid thermal stress. Thus, either polycrystalline silicon or SIPOS are the preferred filler materials as they have the same coefficient of thermal expansion as the surrounding silicon.

For the isolation slots, the actual isolation is accomplished by the thin silicon dioxide layer 37 formed around the interior surface of the bare slot. For the active regions, such as emitter 46" and collectors 45", the slot will be filled with heavily doped SIPOS. Typically, the slot is overfilled, and the surface of the material is planarized by an isotropic etch, such as a fluorinated plasma. The slots are formed, for example, by reactive ion etch equipment, preferably with a chemically active species so that physical and chemical etching steps are combined. See, e.g., D. N. K. Wang et al, "Reactive Ion Etching Eases Restrictions on Materials and Feature Sizes", *Electronics*, Nov. 3, 1983, pp. 157-159.

As shown in FIG. 6, the slot regions and portions of the interior region in which the active device is to be formed are covered with a stop layer 43 of a material, such as silicon dioxide or silicon nitride. This serves to open up a central region 39 in which an emitter slot is to be formed and to protect adjacent regions 38 where collector slots are to be formed. This approach, which permits self-aligned slots to be formed on a semiconductor substrate, is described and claimed in Bower U.S. Pat. No. 4,579,812, issued Apr. 1, 1986. A layer 42 of polycrystalline silicon is then applied which overlies stop etch layer 43 and reaches down onto the surface of substrate 44 within region 39.

Figure 7:
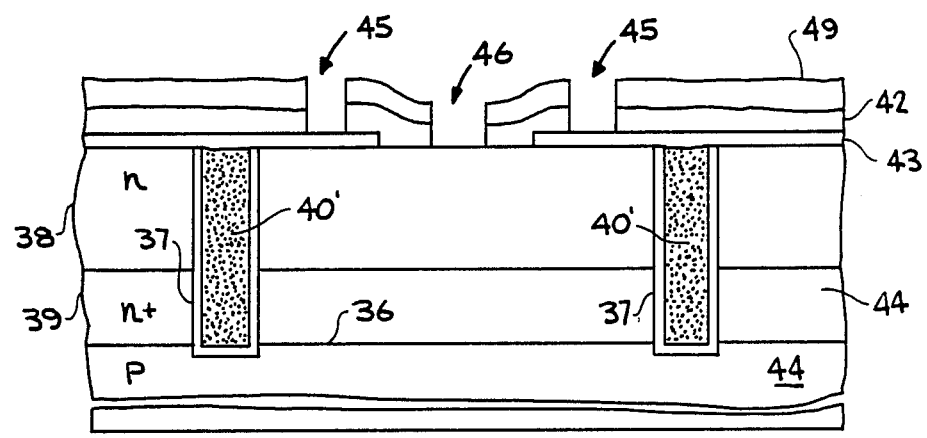

As shown in FIG. 7, a silicon dioxide layer 49 is then formed over polysilicon layer 42. Layers 42 and 49 are patterned to define a first type slot region 46 where emitter slots are to be formed and second type slot regions 45 where collector slots are to be formed. The slot regions are self-aligned as described in detail in the Bowers '812 patent referenced above.

The slot regions are etched down to the silicon substrate, in the case of emitter type slot region 46, and down to stop layer 43, in the case of collector type slot region 45. The etch will have selective properties so that stop layer 43 is not penetrated. See, e.g., L. M. Ephrath, "Reactive Ion Etching for VLSI", *IEEE Transactions on Electron Devices*, v. ed-28, No. 11, November 1983, p. 1315.

Figure 8:
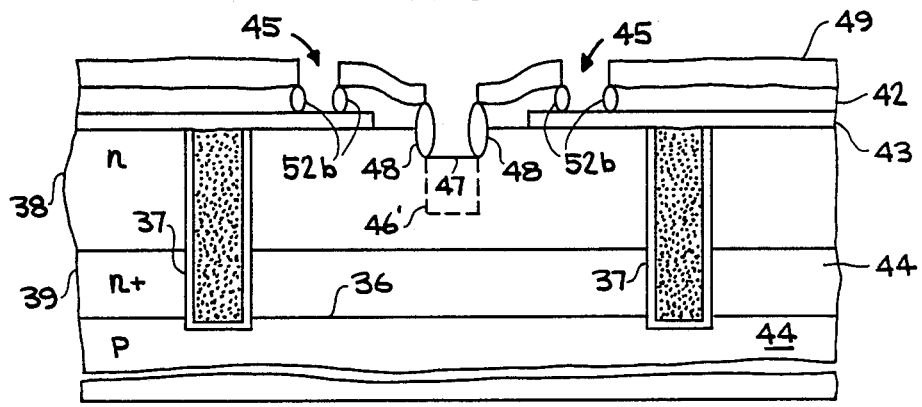

Next, as shown in FIG. 8, the emitter type slot is shown to be partially formed. The dotted line 46' shows the full extent of the slot when it is completely formed whereas the solid line 47 shows the bottom extent of the partially formed slot. After etching the substrate to partially form the emitter slot down to line 47, an oxidizing step is carried out to oxidize the exposed side edges of polysilicon layer 42 in the emitter slot as well as the partially formed collector slots and to oxidize the exposed side edges of the silicon substrate in the partially formed emitter slot.

This oxidation step produces oxidized regions 52b at the exposed edges of the polysilicon layer 42 for the partially formed collector slots and oxidized regions 48 at the exposed polysilicon and silicon edges of the partially formed emitter slot. Oxidized regions 48 will serve to isolate the base contact regions 51 from the active emitter region 46", shown in FIGS. 11-13. Oxidized regions 52b will prevent any dopant incorporated in polysilicon layer 42 from electrically altering the filler material placed in collector slot 45'.

Figure 11:
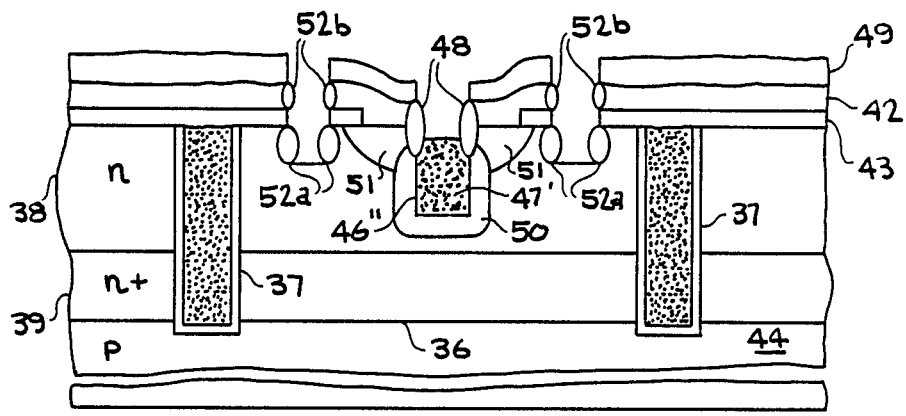
Figure 12:
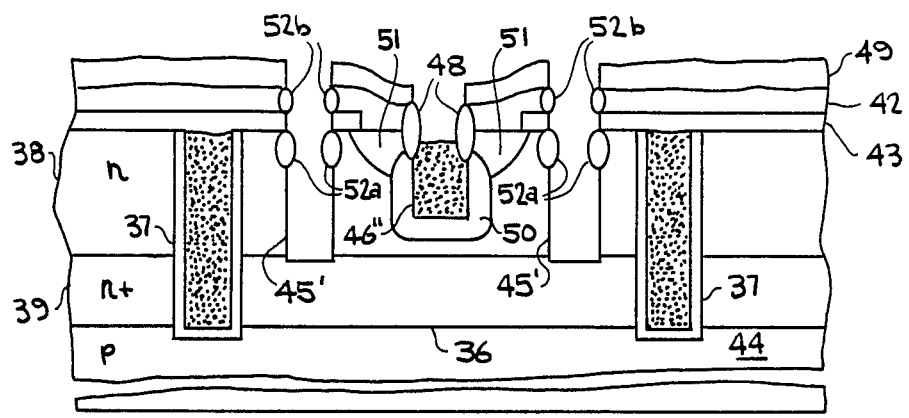

In a preferred embodiment, the oxidized regions 52a shown in FIG. 11 for the collector slots are also formed at this time so as to ensure that the base contacts 51 touch neither the active collector 45" or the active emitter 46". In order to accomplish this result, it is necessary to partially form collector slots 45' so that the upper sidewalls of the slots are exposed during the oxidation step and the exposed silicon is converted to silicon dioxide. Most preferably, the oxidized regions 52a have a lower vertical extent than the oxidized regions 48 to ensure that, in the case of misalignment, there is no contact between the active collector 45" and base contact region 51. In both the emitter and collector slots, however, as best seen in FIG. 12, the extent of the oxidation is about one half of the entire depth of the slot. In the embodiment shown in the figures, the oxidized regions 52a are formed after the base contact regions 51, a practice which is permissible if the slots are self-aligned.

Figure 9:
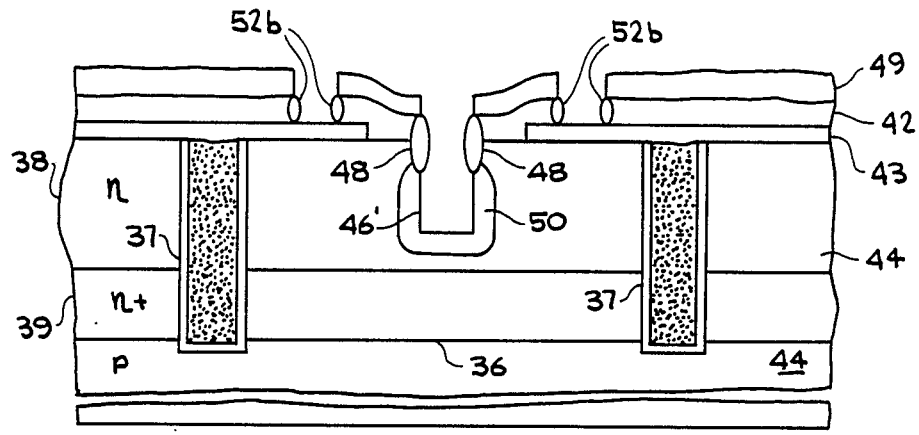

In the embodiment of the figures, the next step, shown in FIG. 9, is the complete formation of the emitter slot 46'. Then, a standard diffusion step is used to produce the active base region 50 adjacent the exposed surfaces of empty slot 46'. Alternately, the emitter slot may be filled with SIPOS having multiple dopants with differential rates of diffusion, e.g., with boron and arsenic. Since boron diffuses more rapidly than arsenic, it may be driven into the surrounding silicon, leaving, e.g., an n-type arsenic-doped emitter and a p-type boron-doped base.

Figure 10:
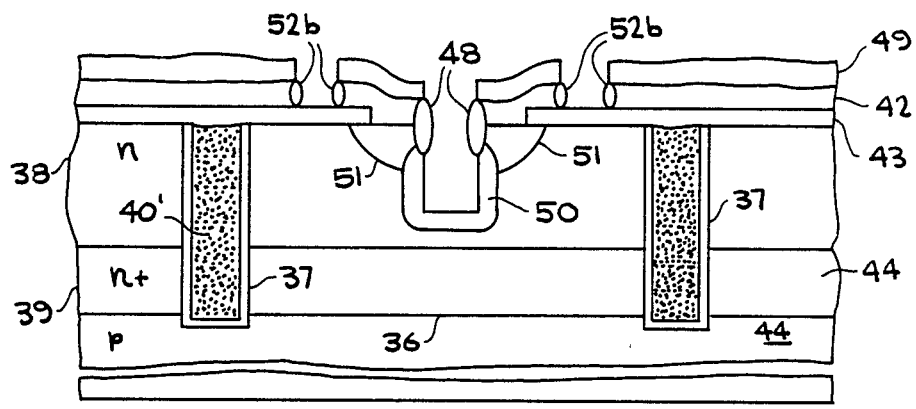

A contact to base region 50 may be formed in a subsequent step by driving a dopant into the upper regions of the base region 50 from the portion of layer 42 adjacent oxidized regions 48. As shown in FIG. 10, the base contact regions 51 may also be formed during the process of driving in the diffusion which produces base region 50 provided that suitable dopant is contained within polysilicon layer 42. The emitter slot 46', if not already filled with SIPOS as described above, is then filled with a suitable filler material 47' to produce an active emitter slot region 46", shown in FIG. 11 and following.

The collector slots 45', if not already partially formed as described above, may now be partially formed, as shown in FIG. 11. In contrast to the preferred embodiment discussion above, the isolation regions 52a are then produced by an oxidation step which oxidizes the portions of the n-type epitaxial layer 38 which are exposed at the upper edges of the slot. These regions serve to isolate the active collector regions 45" to be formed from base contact regions 51. Finally, the collector slot regions 45' are fully formed, as shown in FIG. 12. Oxidized regions 52b which were formed at the same time as oxidized regions 48 (see FIG. 8) serve to keep any doping in polycrystalline silicon layer 42 from altering the electrical properties of the filler material placed in active collector region 45". The completed devices is shown in FIG. 13.

Then, contacts are formed to the respective regions. Since the slots may be much longer than they are wide (see the rectilinear shape of emitter slot 30 of FIG. 3b and the cross shape of emitter slot 32 of FIG. 4b), a contact can be made at a single point or at several points, providing the series resistance to the full volume of the regions is tolerable. As shown in FIG. 13, the contact resistance to the collector regions is reduced by n+ buried collector layer 54 which ties active collector regions 45" together. This buried collector 54 is formed by that part of the n+ layer 39 which is bounded by isolation slots 37.

Figure 13:
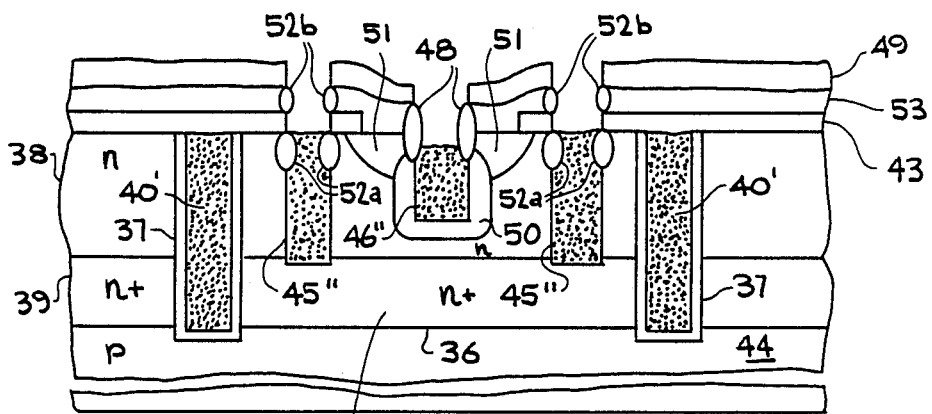

As shown in the cross-sectional drawings of FIGS. 10–13, the base region 50 has already been contacted by contact regions 51. Now, external contacts are made to base, emitter and collector regions. These are applied once the active regions of the transistor are fully formed as shown in FIG. 13.

Figure 14:
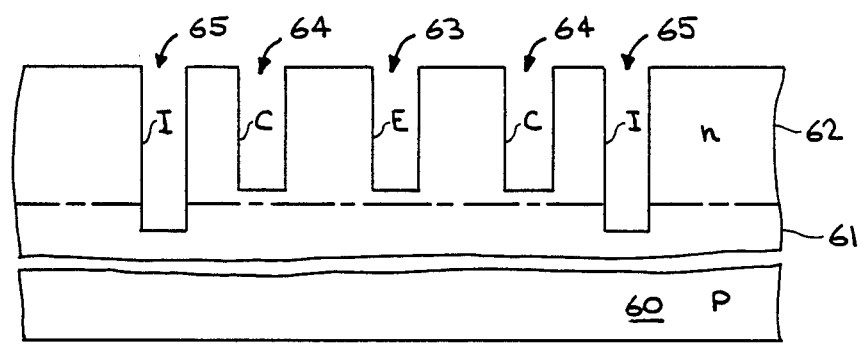
FIG. 14 is a cross-sectional view of a slot transistor having isolation regions which extend through of FIG. 14.
Figure 15:
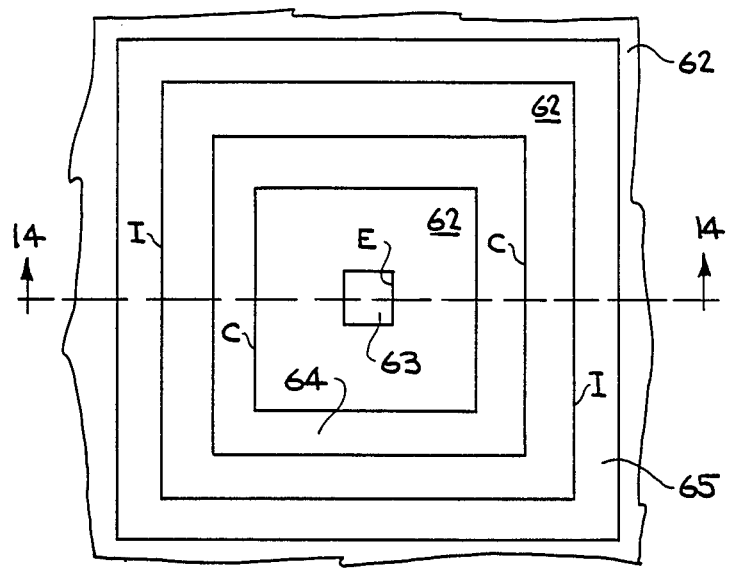
FIG. 15 is a plan view of the slot transistor of FIG. 14.

Various slot isolation schemes are feasible for use in conjunction with the slot transistor structure of the present invention. As shown in FIG. 14 and the plan view of FIG. 15, isolation slot 65, is used in conjunction with the emitter slot 63 and the collector slots 64, fully surround the transistor structure. Preferably, they will be self-aligned as described in the aforementioned Bower '812 patent. Preferably also, the isolation slots 65 will extend through a pn junction separating n− type epitaxial layer 62 and p-type substrate 61.

Figure 16:
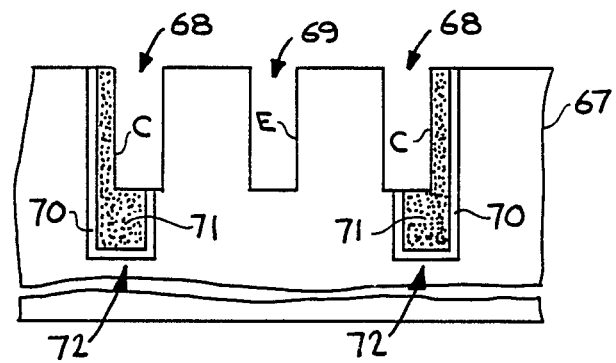
FIG. 16 is a slot transistor having the collector slots formed within isolation slots.
Figure 17:
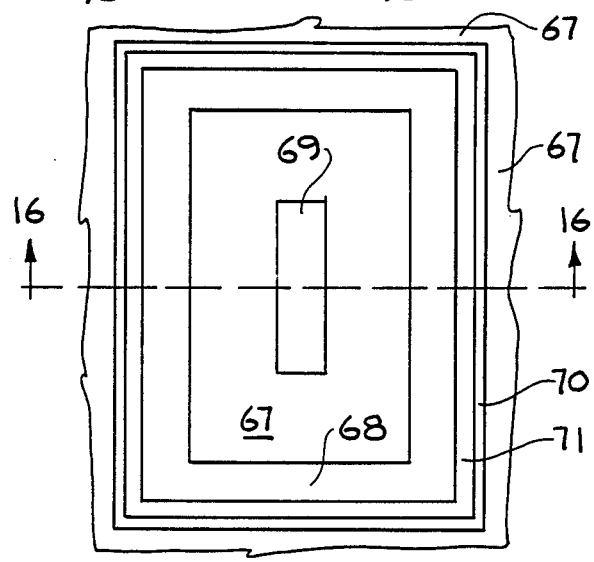
FIG. 17 is a plan view of the contact scheme for one embodiment of the present invention.

Alternatively, for more compact structures, the collector slot 68 may be formed in a portion of previously formed slot 72 in an integrated isolation scheme. As shown in FIG. 16, slot 72 is formed first in the substrate region 67. Then, a thin layer of insulating material, such as silicon dioxide, has been formed, for example, by thermal oxide growth, around the interior surface of oversized slot 72. After being filled with an insulating filler material 71, a smaller slot 68 has been formed within slot 72 in a manner to not disturb the oxide coating of the outer wall. Electrical isolation from adjacent devices is provided by the insulating layer 70 remaining on the outer wall of slot 72. The transistor structure functions as described above once a base region (not shown) is formed around the emitter formed in slot 69. Since the principle of bipolar slot transistors is to increase the vertical extent of the active regions and allow lateral dimensions to be reduced, a practical concern for commercial devices will be the making of electrical contacts to each of the slot regions. The narrowness of the slots makes contact difficult. In addition, in order to avoid high spreading resistance, it will be desired to contact the full extent of the slot or to contact the slot at numerous points along its extent.

Numerous contact schemes are shown in FIGS. 18–24. In FIG. 18, advantage is taken of the use of a buried collector. Thus, it is possible to contact active collector regions 45" by strip 79 at the ends of its U-shaped slot. No significant spreading resistance occurs because of the presence of the buried collector 54 which ties the collector volume together as shown in FIG. 13. The active emitter region 46" is small so that no appreciable spreading resistance is produced by contacting it by layer 80 at an edge, especially since strip 80 contacts almost the complete top of the emitter surface. The base contact is accomplished by base contact layer 42 which runs underneath strip 80 and is separated by insulating layer 49, shown in FIG. 20. In general, it is feasible to contact the closely arrayed bases and emitters because stacked conductive contacts are used with intervening insulating layers.

In FIG. 21, another scheme for contacting the transistor structure of FIG. 18 is shown. Collector contact 82 contacts the back side of the U-shaped active collector region 45". Emitter contact layer 83 substantially covers the surface of active emitter region 46" and is accessible at one side of the transistor structure. The base contact layer 84 contacts substantially all of the base region 50. Here, the emitter contact layer 83 underlies the base contact layer and is separated by an insulating layer of the type shown in FIG. 20.

Contact schemes for embodiments of the present invention which employ integrated isolation are shown in FIGS. 22–24. In FIG. 22, the U-shaped active collector region 87 is formed in the inside of collector slot 88. The active emitter region 86 and the base region 85 are formed, as shown for example in FIG. 16. Contact layer 82 contacts an edge of active collector region 87. No appreciable spreading resistance is experienced due to the use of a buried collector (not shown). Base contact layer 93 contacts substantially all of base region 85. Emitter contact layer 94 contacts a substantial portion of active emitter region 86. As shown, base contact layer 93 overlies emitter contact layer 94; the two layers are separated by an insulating layer (not shown) in the manner shown previously in FIG. 20.

In FIG. 23, an integrated isolation scheme involving spaced-apart parallel collectors and emitters is shown. Here, active collector region 102 is formed in spaced-apart parallel relationship with active emitter region 103. The base region 104 is located adjacent the length of emitter 103.

As shown in the cross-sectional view of FIG. 24, emitter contact 99 extends down to reach active emitter region 103 and extends to one side over the intervening layers of silicon dioxide 49 and polysilicon 42. Similarly, in mirror image fashion, collector contact 97 makes contact with active collector region 102 and extends away to the opposite side over silicon dioxide layer 49 and polysilicon layer 42. Base contact layer 98 extends in an orthogonal direction but reaches down to contact base 104 over the extent of the base. Base contact layer 98 is kept electrically insulated from collector contact layer 97 and emitter contact layer 99 by means of an intervening insulating layer (not shown). In order to avoid an emitter base short, insulating regions 105 have been formed within the filler material in isolation slots 100 and 101. These isolation zones prevent contact between the emitter contact layer 99 and base region 104. The oval regions 106 and 107 are oxidized zones formed as described above with respect to FIGS. 5–13; in similar fashion they serve to prevent shorting between active regions. It should be noted that many contact schemes are feasible. The approaches shown in FIGS. 18–24 are illustrative only.

The foregoing description of a preferred embodiment of the invention has been presented for purposes of illustration and description. It is not intended to be exhaustive or to limit the invention to the precise form disclosed, and obviously many modifications and variations are possible, such as the selection of different substrate, masking and filling materials. The silicon embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended thereto.

TABLE 1

| COMPARISON OF BIPOLAR TRANSISTOR CHARACTERISTICS | | | | | |
|---|---|---|---|---|---|
| Transistor Type | Area* | CCB | RBI | CBE | CCS |
| Bipolar in Literature** | 70 | .37 | .02 | 4.4 | .1 |
| Slot Type | 30 | .34 | .05 | 4.4 | .05 |

*Square Micrometers
CCB is capacitance between base and collector.
RBI is cumulative series resistance from base contact to base region.
CBE is capacitance between base and emitter.
CCS is capacitance between collector and substrate.
**D.D. Tang, et al, "1.25 μm Deep Groove Isolated Self-Aligned Bipolar Circuits", IEEE J. of Solid State Circuits, Vol. 17, October 1982, p. 925.

I claim:

1. An integrated circuit structure comprising a bipolar transistor formed in slots in a semiconductor substrate, said structure comprising:

(a) a substrate comprising a buried collector layer doped to form a layer comprising a first conductivity type, an epitaxially grown layer over said buried layer, a first insulation layer on said epitaxial layer, a doped polycrystalline semiconductor layer on said insulation layer, and a second insulation layer over said polycrystalline semiconductor layer;

(b) a first slot formed in said substrate extending down through said second insulation layer, said doped polycrystalline semiconductor layer, said first insulation layer, and a portion of said epitaxial layer, (c) insulation material formed on the upper portion of the sidewall of said slot comprising the exposed sidewall of said polycrystalline layer and an upper portion of the sidewall of said slot comprising the exposed epitaxial layer to electrically isolate said slot from said doped polycrystalline semiconductor layer and from a base contact region to be formed in said upper portion of said epitaxial layer;

(d) an active base region formed in said epitaxial layer of said substrate adjacent to and surrounding the bottom and sidewalls of said first slot below said portion of said slot sidewall within said epitaxial layer having insulation material thereon, said active base region being formed in said epitaxial layer by diffusing a dopant through the exposed lower portion of the sidewall of said first slot below said portion of said sidewall having insulation formed thereon to form an active base region of opposite conductivity type to said buried collector layer;

(e) a base contact region formed in said upper portion of said epitaxial layer adjacent said insulation material on said slot sidewall within said epitaxial layer, but electrically separated from said slot by said insulation material, said base contact region in said epitaxial layer being formed over said said active base region and in electrical contact with both said doped polycrystalline semiconductor layer and said active base region whereby said polycrystalline region forms a contact for said active base region through said base contact region;

(f) an emitter formed in said first slot in said substrate comprising a semiconductor material of opposite conductivity to said active base region in said epitaxial layer;

(g) a collector contact slot formed in said substrate spaced from said first slot and extending down through said second insulation layer, said doped polycrystalline semiconductor layer, said first insulation layer, and said epitaxial layer, into said buried collector layer;

(h) insulation material formed on the upper portion of the sidewall of said collector contact slot comprising the exposed sidewall of said polycrystalline layer and an upper portion of the sidewall of said collector contact slot comprising the exposed epitaxial layer of approximately the same depth as said base contact region formed in said epitaxial layer to thereby electrically isolate said collector contact slot from said doped polycrystalline semiconductor layer and said base contact region formed in said upper portion of said epitaxial layer; and (i) doped semiconductive material within said collector contact slot comprising an active collector region and a collector contact region to provide electrical contact to said buried collector at the bottom of said collector contact slot.

2. The integrated circuit structure of claim 1 wherein said epitaxial layer comprises a silicon layer.

3. The integrated circuit structure of claim 2 wherein said polycrystalline layer comprises a polysilicon layer.

4. The integrated circuit structure of claim 3 wherein said insulation on at least the upper portion of said first slot and said collector contact slot comprises silicon oxide formed by oxidizing exposed portions of said polysilicon layer and said epitaxial silicon layer after the respective slots are partially formed.

5. The integrated circuit structure of claim 4 wherein said active base region is formed by doping said semiconductor substrate with a dopant diffused through the surface of said first slot not covered with said silicon oxide into said substrate from a doped filler in said first slot.

6. The integrated circuit structure of claim 5 wherein said doped filler material comprises a material having a first dopant therein capable of diffusing into said substrate to form said active base region and a second dopant of opposite conductivity type to form said emitter in said first slot.

7. The integrated circuit structure of claim 6 wherein said insulation layer over said epitaxial silicon layer of said substrate is formed with an opening conforming to the width of said first slot plus an additional distance on each side of said first slot to permit contact between said epitaxial silicon layer and said subsequently formed doped polysilicon layer adjacent said first slot to permit establishment of a conductive path comprising a base contact region through said epitaxial silicon from said active base region in said epitaxial silicon adjacent the lower portion of said first slot to said doped polysilicon base contact layer.

8. The integrated circuit structure of claim 7 wherein said base contact region extending from said active base region to said doped polysilicon base contact layer is formed by diffusing dopants from said polysilicon layer into said epitaxial layer whereby said base contact region is self-aligned with said active emitter region and said active base region.

9. The integrated circuit structure of claim 5 wherein said base region in said substrate surrounding said emitter in said first slot and self-aligned with said emitter comprises a doped region in said substrate formed by doping said substrate using a filler material in said emitter slot having multiple dopants with differential rates of diffusion wherein a first dopant with a faster diffusion rate will diffuse through the walls of said slot into said adjacent substrate to form said base region and another dopant having a slower diffusion rate will form the emitter material in said slot.

10. The integrated circuit structure of claim 9 wherein one or more isolation slots are formed in said substrate in self-alignment with said transistor to isolate it from adjacent devices in said substrate.

11. The integrated circuit structure of claim 10 wherein said collector contact region formed in said collector contact slot is contiguous with said one or more isolation slots surrounding said transistor.

* * * * *